United States Patent
Komatsu

(10) Patent No.: US 12,206,019 B2
(45) Date of Patent: Jan. 21, 2025

(54) SEMICONDUCTOR DEVICE WITH INTERGRATED RESISTOR AT ELEMENT REGION BOUNDARY

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Kanako Komatsu, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 338 days.

(21) Appl. No.: 17/685,257

(22) Filed: Mar. 2, 2022

(65) Prior Publication Data
US 2023/0091860 A1    Mar. 23, 2023

(30) Foreign Application Priority Data

Sep. 22, 2021   (JP) ................... 2021-154693

(51) Int. Cl.
*H01L 29/78*    (2006.01)
*H01L 29/06*    (2006.01)
(Continued)

(52) U.S. Cl.
CPC .......... *H01L 29/7817* (2013.01); *H01L 28/20* (2013.01); *H01L 29/0653* (2013.01); *H01L 29/45* (2013.01); *H01L 29/4933* (2013.01)

(58) Field of Classification Search
CPC ............. H01L 29/7817; H01L 29/7816; H01L 29/7801; H01L 28/20; H01L 29/45
See application file for complete search history.

(56) References Cited

U.S. PATENT DOCUMENTS

| 9,576,948 B2 | 2/2017 | Komatsu et al. |
| 2008/0188053 A1* | 8/2008 | Ting .................. H01L 27/0629 257/E21.09 |

(Continued)

FOREIGN PATENT DOCUMENTS

| JP | H02197172 A | 8/1990 |
| JP | H04348518 A | 12/1992 |

(Continued)

OTHER PUBLICATIONS

Japanese Office Action dated Jun. 18, 2024, mailed in counterpart Japanese Application No. 2021-154693, 6 pages (with translation).

*Primary Examiner* — Wasiul Haider
(74) *Attorney, Agent, or Firm* — & Stewart LLP

(57) ABSTRACT

According to one embodiment, a semiconductor device includes a substrate having a first surface and an insulator that surrounds a first region of the first surface. A gate electrode is on the first region and has a first resistivity. A first conductor is also on the first region. The first conductor comprises a same material as the gate electrode, but has a second resistivity that is different from the first resistivity. The resistivity may be different, for example, by either use of different dopants/impurities or different concentrations of dopants/impurities. Resistivity may also be different due to inclusion of a metal silicide on the conductors or not.

21 Claims, 16 Drawing Sheets

(51) Int. Cl.
*H01L 29/45* (2006.01)
*H01L 29/49* (2006.01)
*H01L 49/02* (2006.01)

(56) References Cited

U.S. PATENT DOCUMENTS

| | | | |
|---|---|---|---|
| 2008/0258232 A1* | 10/2008 | Mizumura | H01L 28/20 |
| | | | 257/E21.616 |
| 2010/0252904 A1 | 10/2010 | Takahashi | |
| 2018/0090382 A1 | 3/2018 | Kawai | |
| 2019/0067273 A1* | 2/2019 | Oe | H01L 27/0288 |
| 2020/0219872 A1 | 7/2020 | Kim | |
| 2021/0074827 A1* | 3/2021 | Nakamura | H01L 29/4238 |

FOREIGN PATENT DOCUMENTS

| | | |
|---|---|---|
| JP | H0812919 A | 2/1996 |
| JP | 2005150712 A | 6/2005 |
| JP | 2010245281 A | 10/2010 |
| JP | 2014187271 A | 10/2014 |
| JP | 2015050386 A | 3/2015 |
| JP | 2018056342 A | 4/2018 |
| JP | 6383325 B2 | 8/2018 |
| JP | 2020074479 A | 5/2020 |

* cited by examiner

FIG. 1
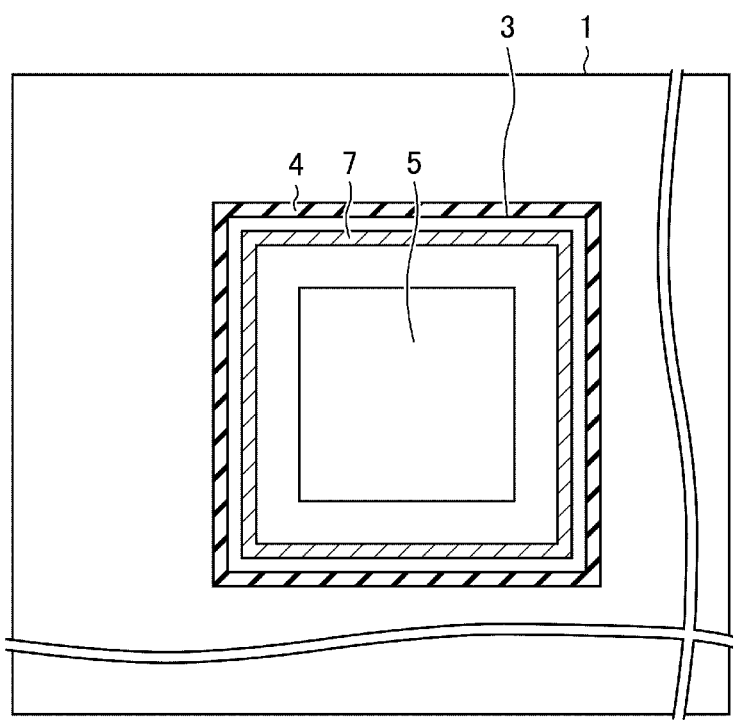
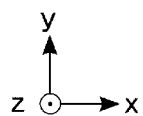

FIG. 3
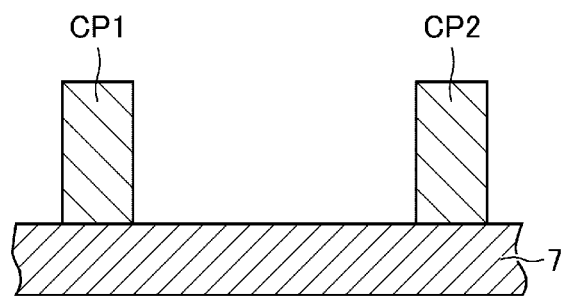
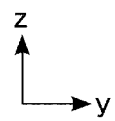
FIG. 4
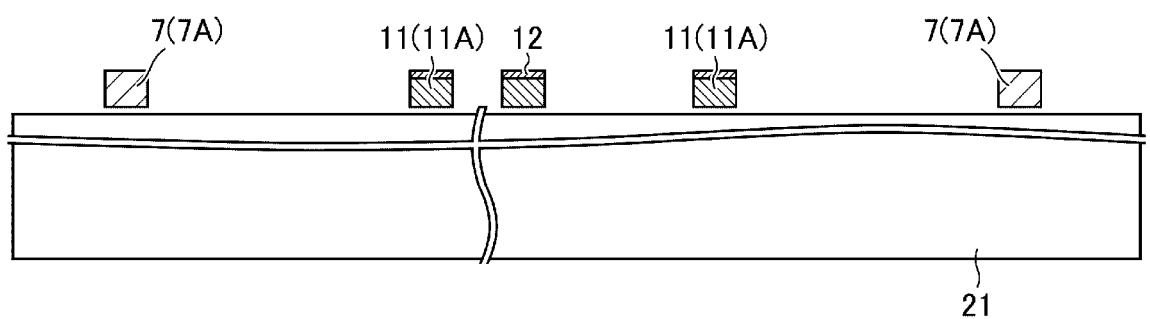
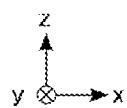

FIG. 10
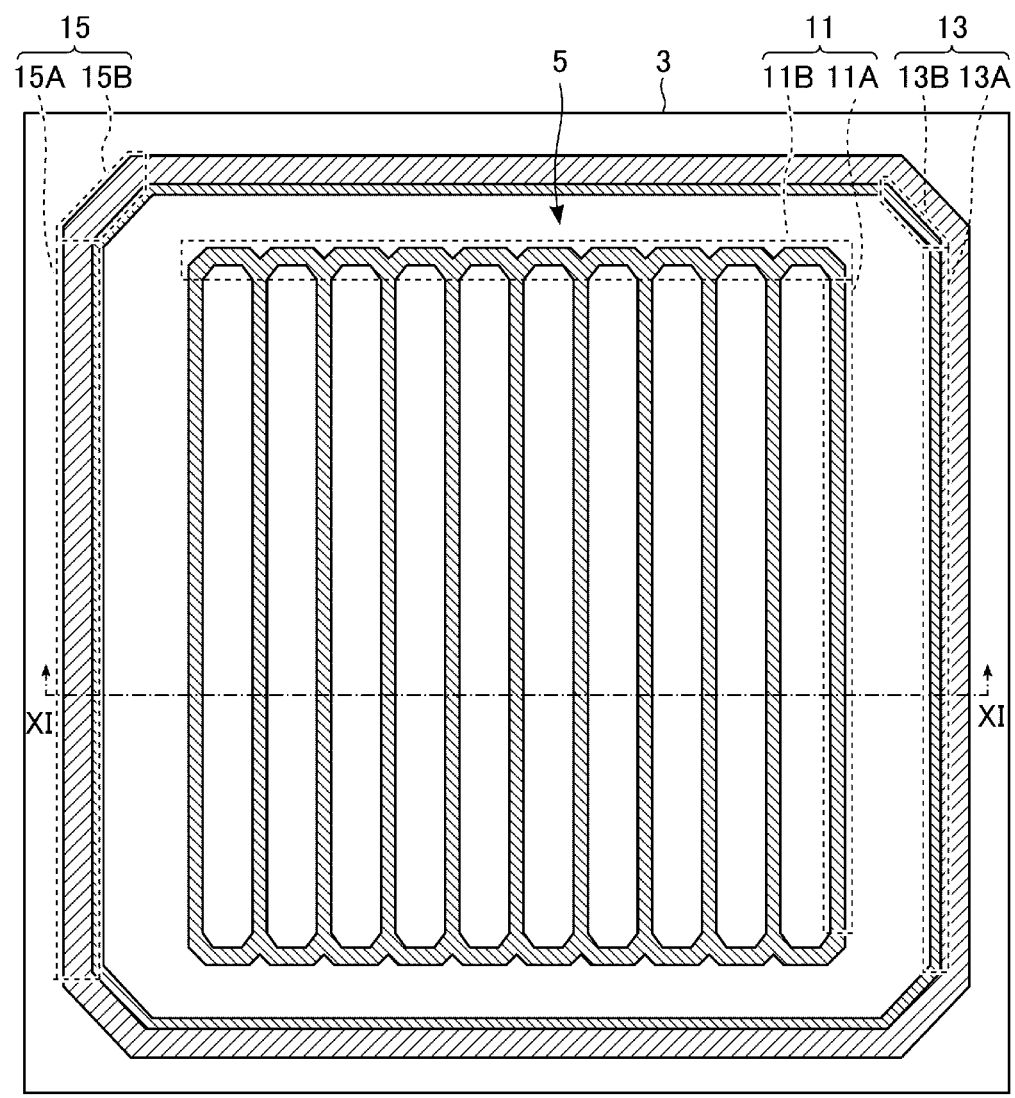
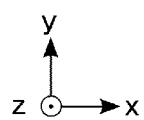

FIG. 12
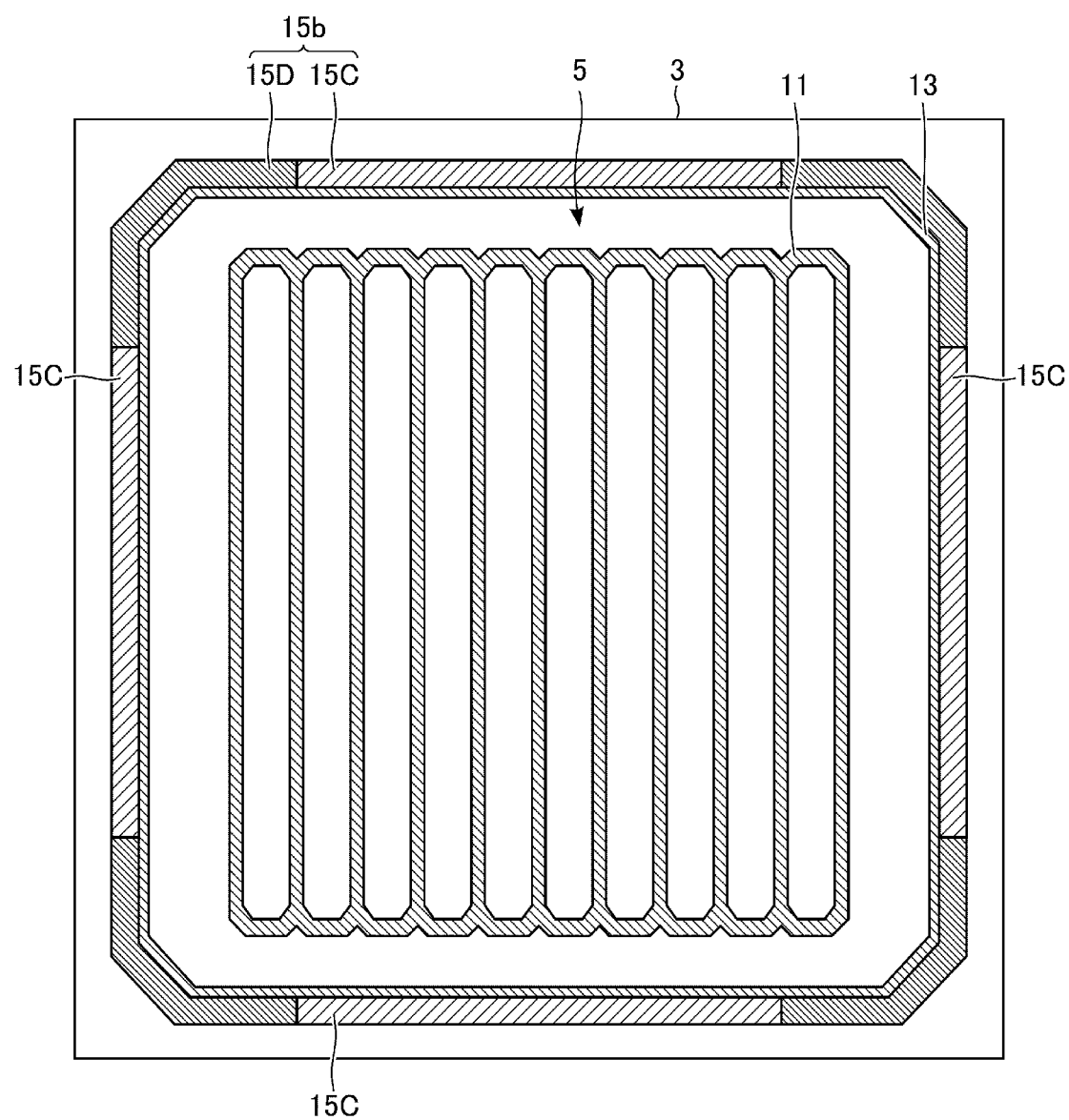
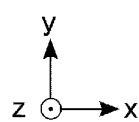

FIG. 14
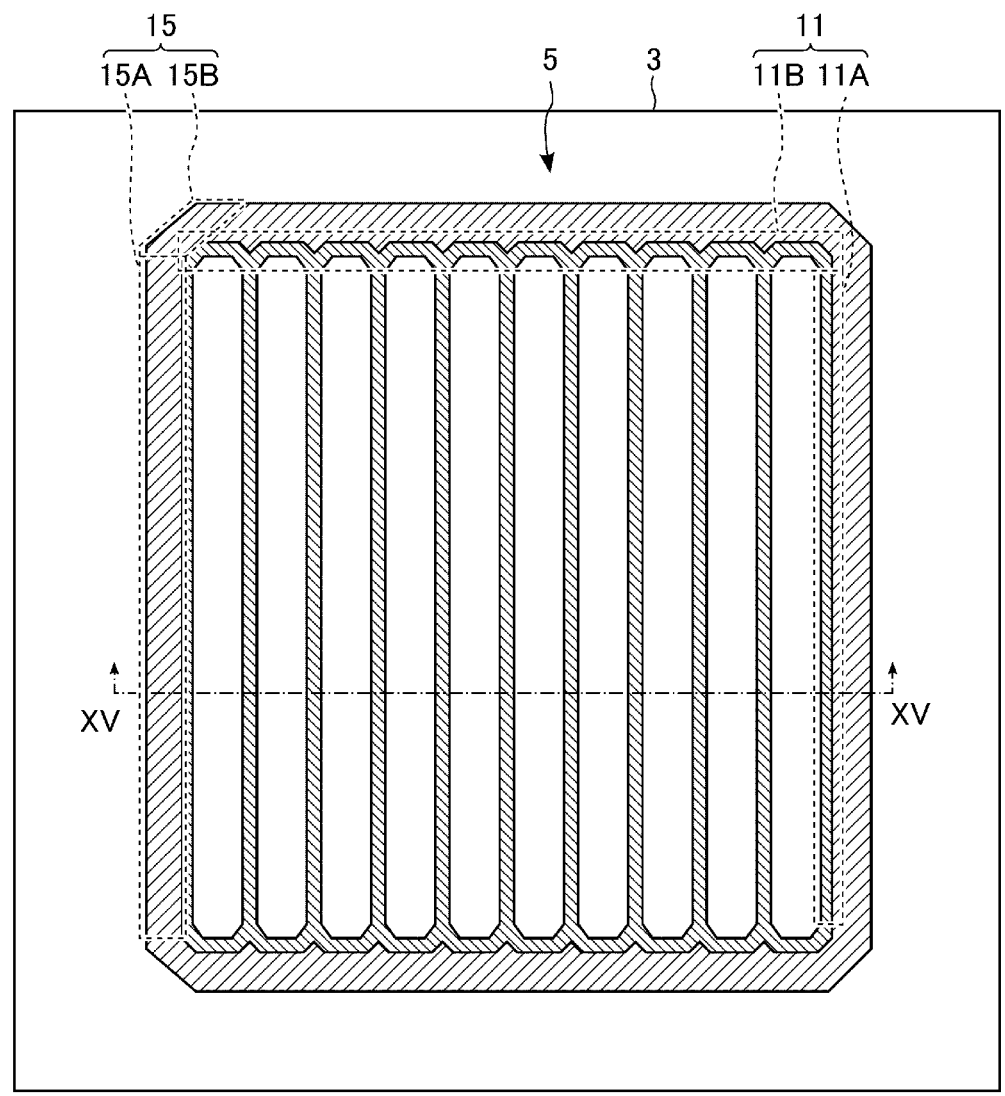
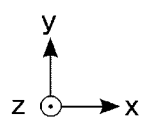

FIG. 15
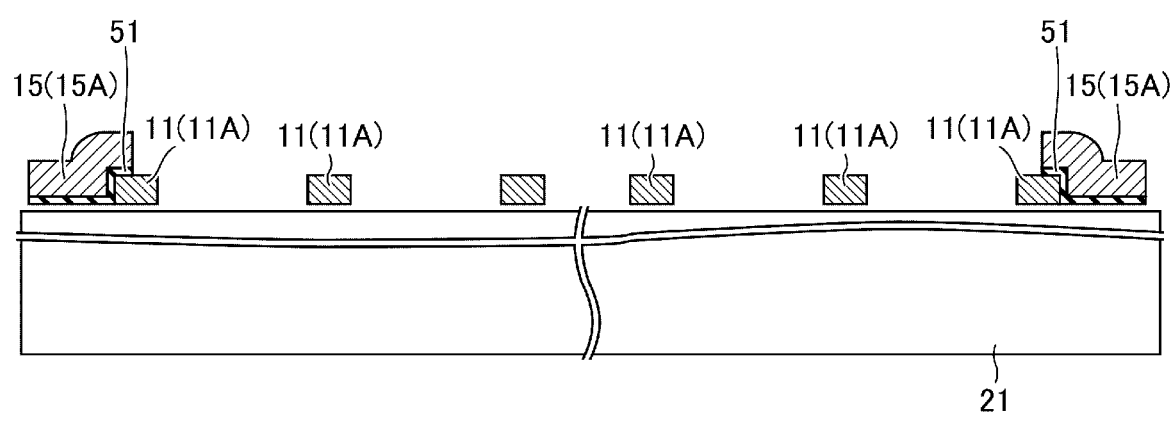
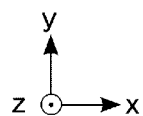

SEMICONDUCTOR DEVICE WITH INTERGRATED RESISTOR AT ELEMENT REGION BOUNDARY

CROSS-REFERENCE TO RELATED APPLICATION

This application is based upon and claims the benefit of priority from Japanese Patent Application No. 2021-154693, filed Sep. 22, 2021, the entire contents of which are incorporated herein by reference.

FIELD

Embodiments described herein relate generally to a semiconductor device.

BACKGROUND

A semiconductor device includes a transistor and a resistance element forming a circuit. The transistor and the resistance element are formed in an element region. Each element region is surrounded by an element separation insulator. Generally, each element is formed in a separate element region.

BRIEF DESCRIPTION OF THE DRAWINGS

FIG. 1 shows a planar structure of a semiconductor device of a first embodiment.

FIG. 3 shows a cross section of a semiconductor device of a first embodiment.

FIG. 4 shows a cross section of a semiconductor device of a first embodiment.

FIG. 10 shows a planar structure of an element region of a semiconductor device of a second embodiment.

FIG. 12 shows a planar structure of elements in an element region of a semiconductor device of a modification example of the second embodiment.

FIG. 14 shows a planar structure of an element region of a semiconductor device of a third embodiment.

FIG. 15 shows a cross section of an element region of a semiconductor device of a third embodiment.

DETAILED DESCRIPTION

Figure 2:
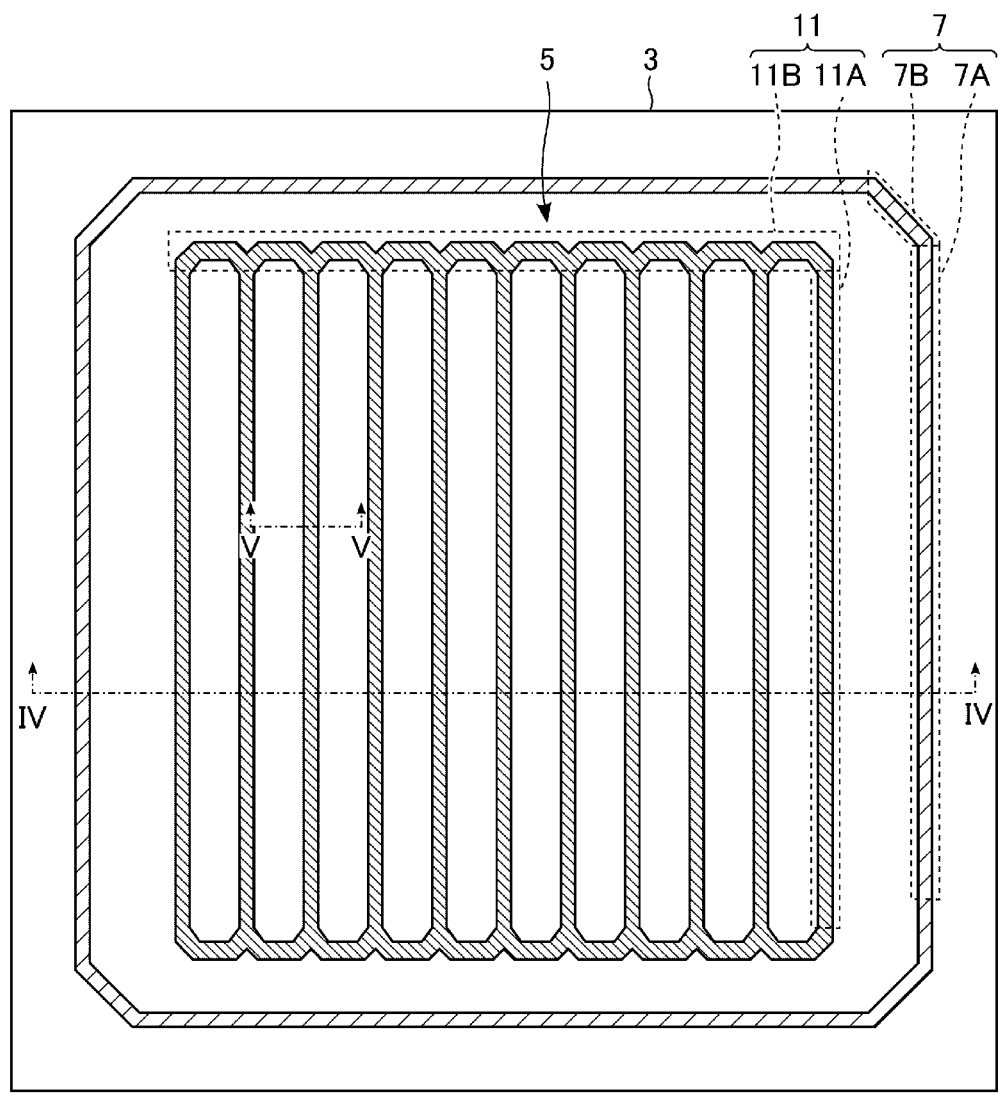
FIG. 2 shows a planar structure of elements in an element region of the semiconductor device of the first embodiment.

Embodiments provide a semiconductor device having a reduced area.

In general, according to one embodiment, a semiconductor device includes a substrate having a first surface and an insulator that surrounds a first region of the first surface. A gate electrode is on the first region and has a first resistivity. A first conductor is on the first region. The first conductor comprises a same material as the gate electrode, but has a second resistivity that is different from the first resistivity.

Example embodiments are described below with reference to the drawings. In the following description, elements having substantially the same function and configuration are designated by the same reference numeral, and the repeated description may be omitted. Suffixes (such as numbers or letters) may be added to the ends of the reference numerals to distinguish elements in a plurality of elements having substantially the same function and configuration. For elements having similar function and configuration in more than one embodiment, suffixes (such as numbers or letters) may be added to the reference numerals of the elements in subsequent embodiments, thereby distinguishing from the elements in the preceding embodiments. Other than with respect to points specifically described as differing from a preceding embodiment, all other aspects may be considered to correspond to those described for the preceding embodiment(s).

Each embodiment exemplifies a device or a method embodying the technical concepts of the present disclosure, and details related to materials, shapes, structures, or the like of a component may be varied without departing from the disclosed technical concepts.

In general, the drawings are schematic, and the depicted relationship between thicknesses, planar dimensions, the ratio dimensions of different elements, or the like may differ from actual ones.

1. First Embodiment

1.1. Structure (Configuration)

FIG. 1 shows a planar structure of a semiconductor device of a first embodiment, and shows a structure along an xy plane when observed from above along a z-axis. A semiconductor device 1 is, for example, a quadrangular semiconductor chip, and is formed on a semiconductor substrate 21 (see, e.g., FIG. 4). The semiconductor device 1 includes an element region 3. The element region 3 has, for example, a quadrangular shape. The element region 3 is surrounded by an element separation insulator 4.

The element separation insulator 4 is formed in the substrate as a STI (Shallow Trench Isolation) feature. The element separation insulator 4 is provided in a region including a surface of the substrate 21. The element separation insulator 4 has the same cross-sectional structure as that of insulator 31 shown in FIG. 5.

The element 5 and the conductor 7 are formed in the element region 3. The element 5 may be any element that can be formed on a semiconductor chip. An example of the element 5 includes a MOSFET (Metal Oxide Semiconductor Field Effect Transistor).

The conductor 7 faces an edge of the element region 3 and extends along the edge of the element region 3. That is, the conductor 7 has four straight line portions along the four sides of the element region 3.

FIG. 2 shows an example of the planar structure of elements in the element region 3. FIG. 2 shows a structure along the xy plane when observed from above along the z-axis. FIG. 2 shows an example in which the element 5 is the MOSFET. The element 5 may also be referred to as a transistor 5. FIG. 2 shows only some elements of the element region 3.

As shown in FIG. 2, the semiconductor device 1 includes a conductor 7 and a conductor 11. The conductor 11 constitutes a part of the transistor 5 and functions as a gate electrode of the transistor 5. The conductor 11 may also be referred to as a gate electrode 11.

The conductor 11 has a shape of a grid along the xy plane. That is, it includes a plurality of portions 11A and two portions 11B. The portions 11A have a linear shape, extend along the y-axis, and are arranged at intervals along the x-axis. The portion 11B extends along the x-axis. One portion 11B is connected to an upper end of each portion 11A. The other portion 11B is connected to a lower end of each portion 11A. The conductor 11 comprises or is substantially made of polysilicon that is conductive, for example by the introduction of carriers (dopants). In the present specification, the statement that an element is "substantially" or "substantially configured" from a material does not exclude the possibility of unintended impurities.

The conductor 11 may comprise silicide (metal silicide) as a whole or in a region including the upper surface along the z-axis.

The conductor 7 extends along an edge of the element region 3 and surrounds the conductor 11. More specifically, the conductor 7 includes four portions 7A. One portion 7A extends along the x-axis and along a lower end of the element region 3. One portion 7A extends along the x-axis and along an upper end of the element region 3. One portion 7A extends along the y-axis and along a right end of the element region 3. One portion 7A extends along the y-axis and along a left end of the element region 3. Two portions 7A along two adjacent sides of the element region 3 are connected to each other. Alternatively, the two portions 7A along the two adjacent sides of the element region 3 may be connected by the portion 7B of the conductor 7. FIG. 1 shows such an example. Each portion 7B is located in a region including a corner of the element region 3 and connects one portion 7A extending along the x-axis and one portion 7A extending along the y-axis. The portion 7B intersects, for example, the x-axis and the y-axis and has, for example, an angle of 45 degrees with respect to the x-axis.

The conductor 7 is located at a boundary between a region where the portion 11A of the conductor 11 is provided and a region where the conductor 11 (more particularly the portion 11A) is not provided. The conductor 7 is provided for the following purposes. There can be a large difference in pattern density in the region where the portion 11A is provided and other regions. Such a difference affects the process for forming the portion 11A at the boundary between the dense and non-dense pattern regions. This means that the shape of the outermost portion 11A may significantly differ from the shape of the other portions 11A in the interior region. The conductor 7 may help alleviate or compensate for this issue.

The conductor 7 is derived from the same material as the conductor 11. That is, the conductor 7 and the conductor 11 can be formed by partial removal of the same material layer or the like. When the conductor 11 is polysilicon, the conductor 7 is also polysilicon.

The conductor 7 has a resistivity that is different from the resistivity (or conductivity) of the conductor 11.

The conductor 7 includes carriers of a type different from the type of the carriers (impurities) provided in the conductor 11. The conductor 7 may include an amount of the carriers that is different from the amount of the carriers provided in the conductor 11. For example, the concentration of carriers provided in the conductor 7 can be less than the concentration of the carriers provided in the conductor 11. The resistivity can differ according to a ratio of silicide in the conductor 11. For example, the ratio of silicide in the conductor 7 can be lower than the ratio of silicide in the conductor 11.

The conductor 7 may be used as a resistor (a resistive element). For that purpose, the resistivity of the conductor 7 can be adjusted so as to have a resistivity higher than that of the conductor 11. Specifically, the conductor 7 includes an amount and/or type of the carriers that provides the conductor 7 with a resistance of a desired magnitude in a circuit for use as a resistor, and/or has a ratio of silicide providing such resistance. The conductor 7 may also be referred to as a resistor 7 when being used as a resistive element or the like.

The resistor 7 may be used as any resistor used in the semiconductor device 1. The resistor 7 may be used, for example, as a resistor that forms a circuit with the transistor 5 and is connected to a node near the transistor 5. An example is when the transistor 5 and the resistor 7 form part of an ESD (Electro Static Discharge) protection circuit. Specifically, the resistor 7 may be connected between a gate and a source of the transistor 5. Alternatively, the resistor 7 may be used as a pull-down resistor for the transistor 5. Specifically, the resistor 7 in such a case may be connected between the source and ground of the transistor 5.

As shown in FIG. 3, the conductor 7 is in contact with each of two independent conductors at least in two places, respectively. FIG. 3 shows a cross section of a part of the semiconductor device of the first embodiment. FIG. 3 shows an example in which the conductor 7 is in contact with two contact plugs CP1 and CP2 on the upper surface of the conductor 7. At least a portion of the conductor 7 between these contact plugs CP1 and CP2 may function as a resistor.

FIG. 4 schematically shows a cross section of a part of the semiconductor device of the first embodiment, and shows a cross section along the IV-IV line of FIG. 2. In FIG. 4, some elements including the elements inside the substrate 21 are omitted for the purpose of avoiding unnecessary complexity of the drawing. As shown in FIG. 4, for example, the conductor 11 (more particularly, portion 11A) and the resistor 7 (more particularly, portion 7A) are provided above an upper surface on an upper side of the silicon substrate 21. FIG. 4 shows an example in which a part (an upper portion of the gate electrode 11 includes the silicide 12, but the resistor 7 does not include silicide).

Figure 5:
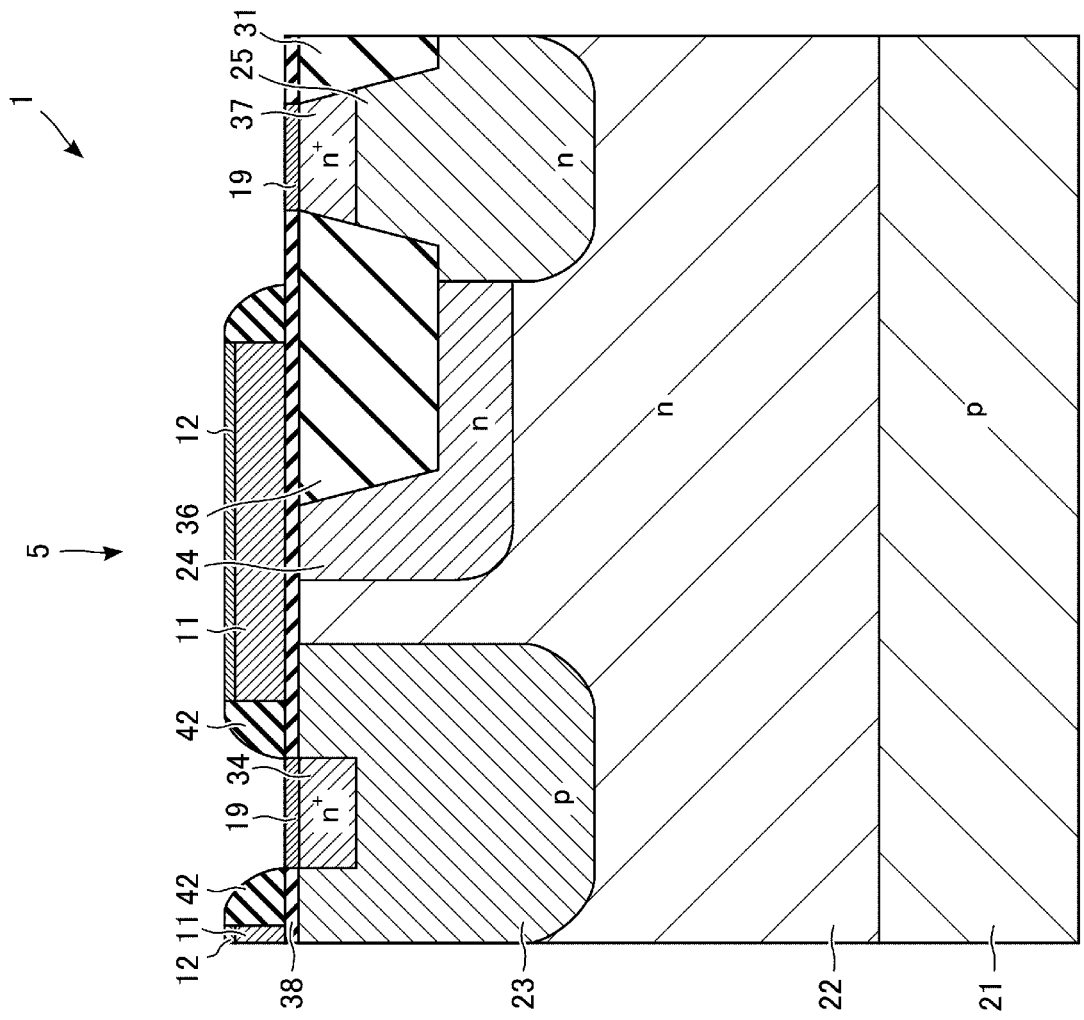
FIG. 5 shows a cross section of a semiconductor device of a first embodiment.

FIG. 5 shows a cross section along the V-V line of FIG. 2. FIG. 2 is an example in which the element 5 is a MOSFET transistor. The transistor 5 may have any structure. Examples of a transistor 5 include DMOS (Double Diffused Metal Oxide Semiconductor field effect transistor), LDMOS (Laterally Disused Metal Oxide Semiconductor field effect transistor), DEMOS (Drain Extended Metal Oxide Semiconductor field effect transistor), and EDMOS (Extended Drain Metal Oxide Semiconductor field effect transistor). FIG. 5 shows the transistor 5 as a LDMOS as an example.

As shown in FIG. 5, the semiconductor device 1 includes a semiconductor substrate 21 such as silicon. The substrate 21 has a p-type resistivity. A p-type element or region include p-type carriers therein. A p-type element or region has a concentration of p-type impurity that is greater than the concentration of n-type impurities.

An n-type deep well or an impurity region (deep n-well) 22 is formed in a region on the upper surface of the substrate 21. The p-type well or an impurity region (p-well) 23 is provided in a region on the upper surface of the deep n-well 22. The n-type element and region include the n-type carriers. The n-type element or region has a concentration of n-type impurities that is greater than the concentration of p-type impurities.

An n-type drift region 24 is provided in a region on the upper surface of the deep n-well 22. The n-type drift region 24 may be in contact with the p-well 23.

An n-type well 25 is provided in a region on the upper surface of the deep n-well 22. The n-well 25 is located farther from the p-well 23 than the n-type drift region 24. The n-well 25 is in contact with the n-type drift region 24.

An insulator 31 is provided in a region on the upper surface of the deep n-well 22. A part of the insulator 31 is located in a region on the upper surface of the n-well 25.

The region on the p-well 23 functions as a body region of the transistor 5. A region on the upper surface of the body region functions as a channel region. The channel region is a region in which a channel is formed while the transistor 5 is on (conductive state).

An $n^+$ type source region 34 is provided in a region on the upper surface of the p-well 23. The superscripts "+" and "−" on the conductive type "n" or "p" indicate a relative carrier concentration. For example, a $p^+$ type region has a higher carrier concentration than that of a p type region. In this context, carrier concentration refers to the net concentration of the p-type impurities excluding the amount of the p-type impurities offset by n-type impurities when the region includes both p-type impurities and n-type impurities. The same applies to the n-type resistivity. The silicide 19 is provided on the upper surface of the $n^+$ type source region 34.

The insulator 36 is provided in a region on the upper surface of the n-type drift region 24 and the n-well 25. The insulator 36 extends over the n-type drift region 24 and the n-well 25. The bottom surface of the insulator 36 does not meet the bottom surface of the n-type drift region 24, so that a part of the n-type drift region 24 is located below the insulator 36. The edge of the insulator 36 farther from the n-well 25 does not meet the edge of the n-type drift region 24.

An $n^+$ type drain region 37 is provided in a region on the upper surface of the n-well 25. The silicide 19 is provided on the upper surface of the $n^+$ type drain region 37.

The insulator 38 is provided on the upper surface of the substrate 21, that is, on the upper surface of the deep n-well 22. The insulator 38 is located on the upper surfaces of the p-well 23, the n-type drift region 24, and the n-well 25. A part of the insulator 38 functions as a gate insulator of the transistor 5.

The gate electrode 11 is provided on a part of the upper surface of the insulator 38. The gate electrode 11 extends along the x-axis and is provided continuously over at least the region above the p-well 23 and the region above the insulator 36. The upper portion of the gate electrode 11 includes the silicide 12. The portion of the insulator 38 below the gate electrode 11 functions as the gate insulator of the transistor 5.

The x-axis ends of the gate electrode 11 are covered by the side wall insulator 42. A part of the side wall insulator 42 is located above the p-well 23.

1.2. Advantages (Effects)

According to the first embodiment, it is possible to provide a semiconductor device 1 in which a required area is reduced.

A comparative semiconductor device is briefly described for reference and comparison to semiconductor 1. Like the semiconductor device 1, the comparative semiconductor device requires a resistor in a circuit. The resistor of the comparative semiconductor device is separately formed in another element region other than the element region 3 in which a transistor element is provided. Each element region needs to be surrounded by its own element separation insulator structure. Therefore, for formation of the element region for a resistor requires not only the area of the element region itself but also a region for forming another element separation insulator structure. The larger number of element regions means that a larger area.

The comparative semiconductor device includes a dummy gate electrode instead of the conductor 7 of the semiconductor device 1 of the first embodiment. The dummy gate electrode has the same structure as the conductor 7, and is similarly used to prevent variations in shape when the gate electrode 11 being formed. On the other hand, unlike the conductor 7, the dummy gate electrode generally has the same resistivity as that of the gate electrode 11. That is, it is not endowed with electrical properties different from those of the gate electrode 11. Therefore, the dummy gate electrode only has purpose related to the manufacturing of the comparative semiconductor device, and does not serve any function after the semiconductor device has been manufactured. Therefore, there is potentially room for utilization of the dummy gate electrode for some post-manufacturing purpose.

The semiconductor device 1 of the first embodiment includes the conductor 7. The conductor 7 is provided for one purpose of preventing the variation in the shape of the gate electrode 11 when the gate electrode 11 is being formed during the manufacture of the semiconductor device 1, and has no function after the formation of the gate electrode 11, and generally does not affect the function and characteristics of the transistor 5. On the other hand, unlike the dummy gate electrode in the comparative device, the resistivity of the conductor 7 has been adjusted so as to have a resistivity different from that of the gate electrode 11. By adjusting the resistivity, the conductor 7 may have a resistance of any desired magnitude. Therefore, the conductor 7 may be used as a resistor in the circuit of the semiconductor device 1. By using the elements that otherwise only play a role during the manufacture of the semiconductor device 1, a resistor may be formed in the element region 3 without affecting the formation and characteristics of the transistor 5. This means that the transistor 5 and the resistor 7 are integrated in one element region 3, and thus, an area (separate element region 3) is not required for resistor 7 formation and the occupied area of the semiconductor device 1 can be reduced.

1.3. Modification Examples

Figure 6:
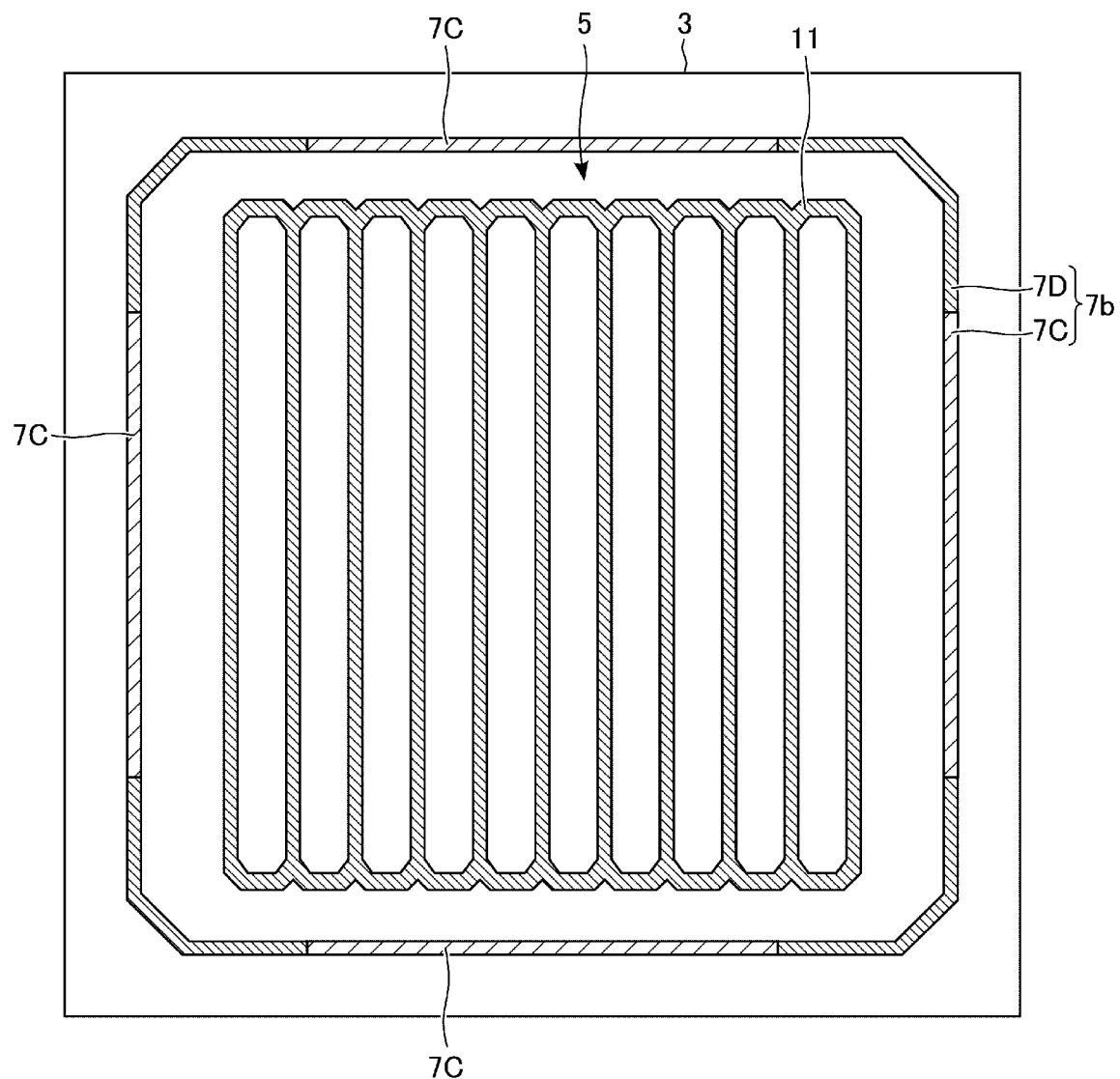
FIG. 6 shows a planar structure of elements in an element region of a semiconductor device of a modification example of the first embodiment.
Figure 7:
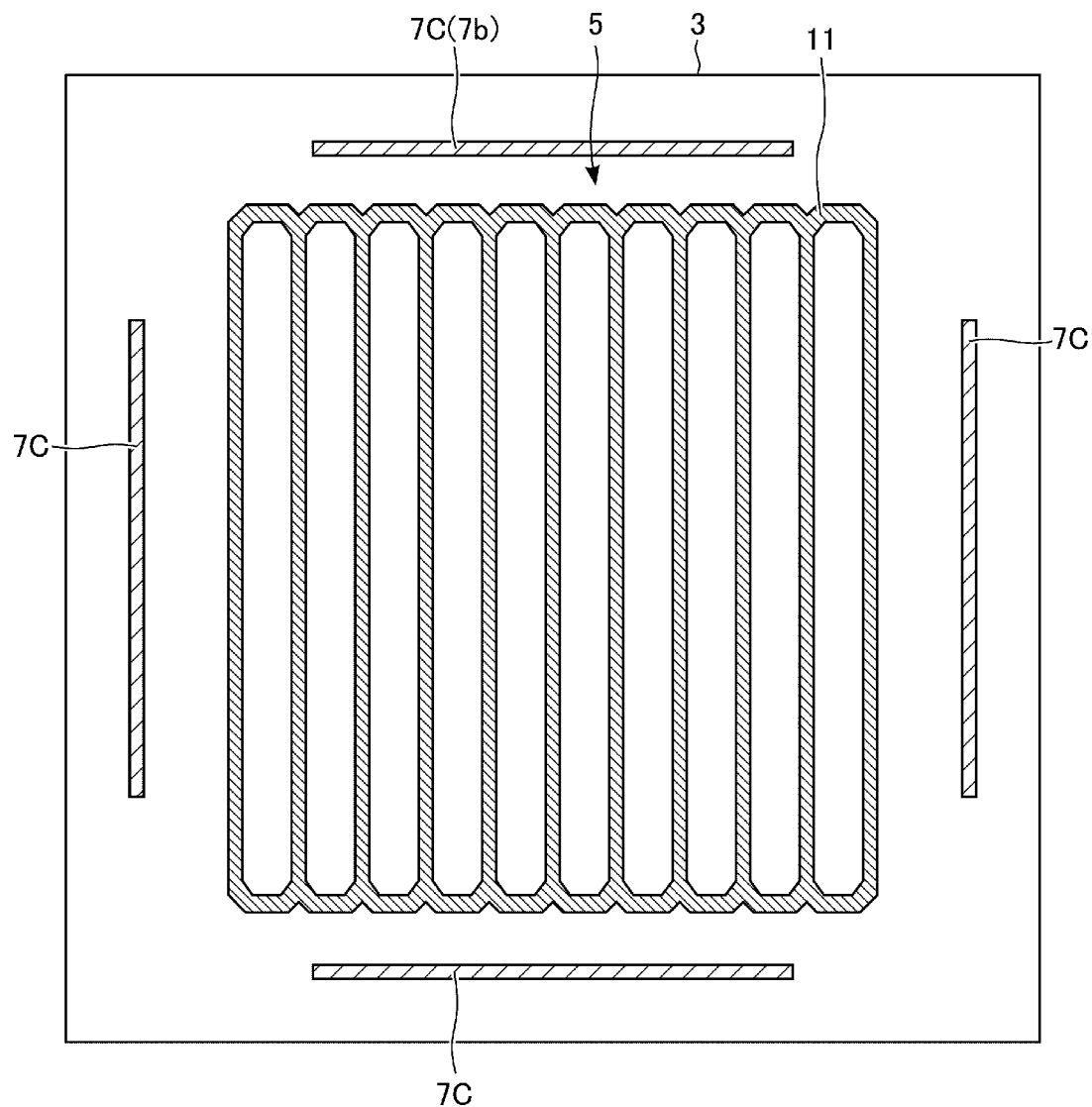
FIG. 7 shows a planar structure of elements in an element region of a semiconductor device of a modification example of the first embodiment.
Figure 8:
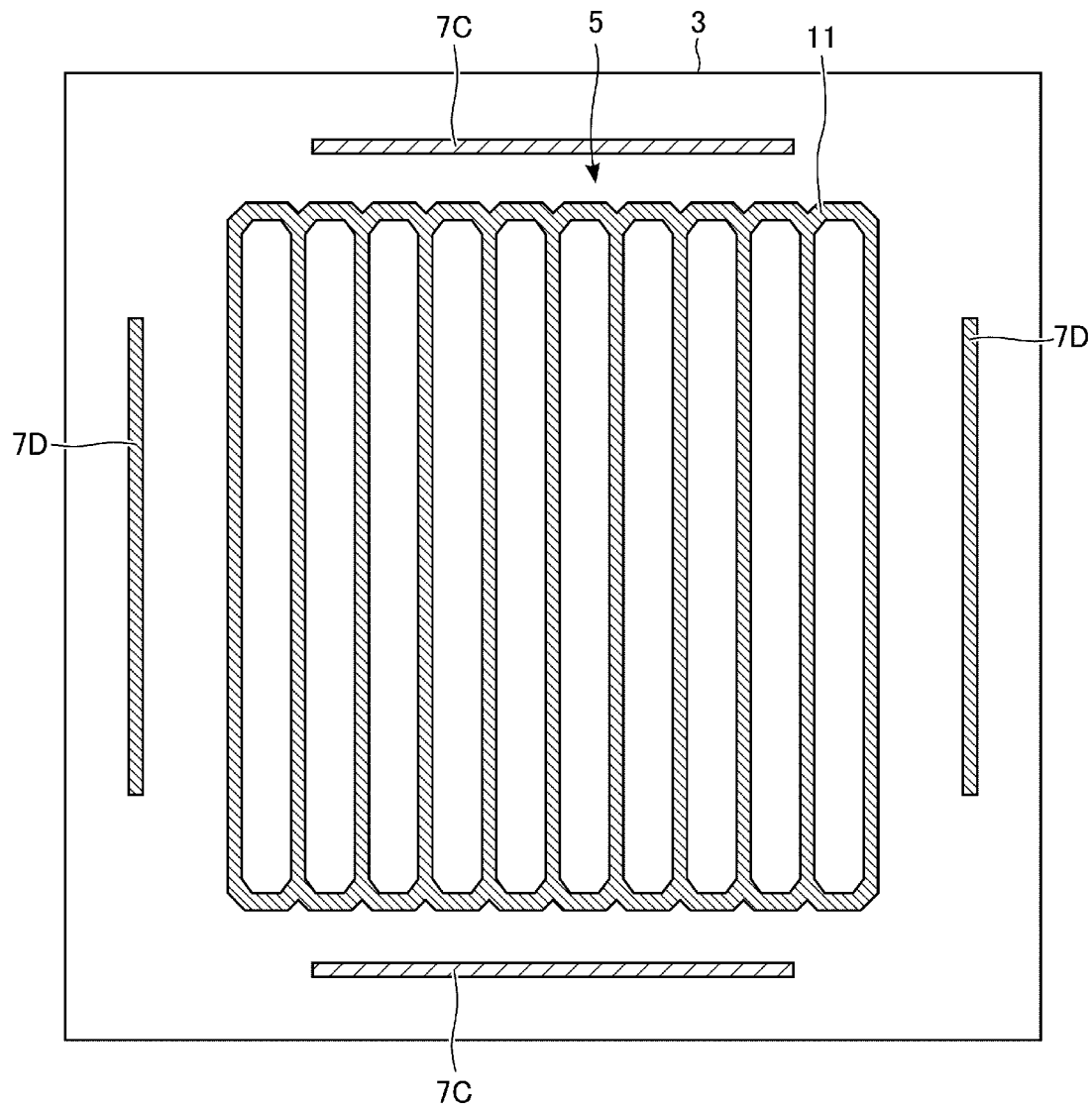
FIG. 8 shows the planar structure of elements in an element region of a semiconductor device of a modification example of the first embodiment.

The conductor 7 need not have to extend over the entire edge of the element region 3. Further, the conductor 7 may include a plurality of independent (separate) portions. FIGS. 6 to 8 show a semiconductor device 1 of a modification example of the first embodiment. FIGS. 6 to 8 show the same region as in FIG. 2.

As shown in FIG. 6, a conductor 7b is provided in place of the conductor 7. Like the conductor 7, the conductor 7b extends along the edge of the element region 3 and surrounds the transistor 5. The conductor 7b includes a portion 7C and a portion 7D. The portion 7C is the same as the conductor 7 except for the shape. That is, like the conductor 7, the resistivity of the portion 7C is adjusted to be different from that of the conductor 11. That is, the resistivity of the conductor 7 is only partially so as to be altered in specific portions to be different from that of the conductor 11. Like the conductor 7, the portion 7C includes the carriers of a type and/or concentration to have a resistance of a desired magnitude, and/or has a ratio of the silicide. Like the conductor 7, the portion 7C may be used as a resistor.

On the other hand, the portion 7D has substantially the same resistivity as that of the conductor 11, that is, the resistivity is not changed. Therefore, the portion 7D includes, for example, the carriers of the same type and concentration as that of the conductor 11, and/or includes the silicide in the upper portion.

The portion 7C may occupy any portion of the conductor 7b. That is, the portion 7C may have a size providing a resistance of the required magnitude for the portion 7C. FIG. 6 shows an example in which individual portions 7C occupy a part of four straight line portions of the conductor 7b along the edge of the element region 3. Each portion 7D is located in a region on a corner of the element region 3.

Through the adjustment of the size of the portions 7C, it is possible to adjust the magnitude of the resistance provided by a portion 7C.

FIG. 6 shows an example in which the portion 7C is provided at a position along all the sides of the edge of the element region 3. Modification examples are not limited to this. For example, the portion 7C may be located in only one, two, or three of the four straight line portions. The portion 7C may be located on any of the four straight line portions. For example, the portion 7C may be located only on the upper straight line portion and the lower straight line portion along the y-axis. Alternatively, the portion 7C may be located only on the left straight line portion and the right straight line portion along the y-axis.

As shown in FIG. 7, the portions 7D need not be provided.

As shown in FIG. 8, the portions 7C and the portions 7D may be independent (unconnected). For example, the portion 7D in FIG. 8 has a linear shape, extends along the y-axis direction and is located between the left side of the element region 3 and the transistor 5 and/or between the right side of the element region 3 and the transistor 5. The portion 7C extends along the x-axis direction and is located between the upper side of the element region 3 and the transistor 5 and/or between the lower side of the element region 3 and the transistor 5.

2. Second Embodiment

A second embodiment differs from the first embodiment in that the structure of the conductor used as a resistor.

2.1. Structure (Configuration)

Figure 9:
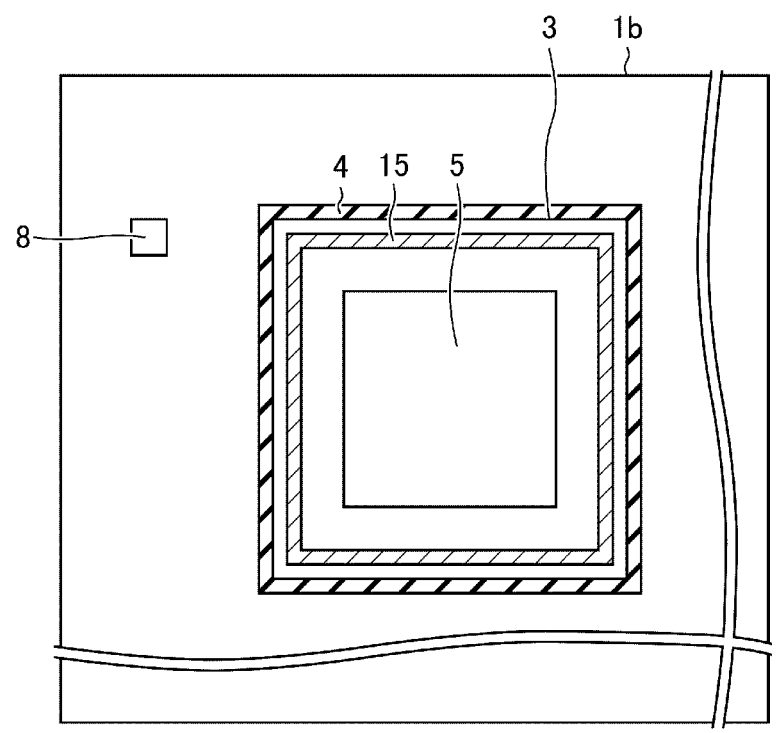
FIG. 9 shows a planar structure of a semiconductor device of a second embodiment.

FIG. 9 shows a planar structure of a semiconductor device 1b of the second embodiment, and shows a structure along the xy plane when observed from above along the z-axis. A semiconductor device 1b of the second embodiment includes a conductor 15. Like the conductor 7, the conductor 15 faces an edge of an element region 3 and extends along the edge of the element region 3.

The semiconductor device 1b further includes a capacitor 8. The capacitor 8 is formed in an element region different from the element region 3 in which the transistor 5 is formed. In other examples, the capacitor 8 may be provided as a separate element having, for example, two layers of conductors (for example, polysilicon), and may be mounted on the semiconductor device 1b in a mixed manner.

FIG. 10 shows an example of a planar structure of elements in the element region 3 of the semiconductor device 1b of the second embodiment. FIG. 10 shows a structure along the xy plane when observed from above along the z-axis. FIG. 10 shows only some elements of the element region 3.

As shown in FIG. 10, the conductor 13 has generally the same structure as the conductor 7 of the first embodiment. The conductor 13 includes four portions 13A and four portions 13B. The portions 13A and 13B have the same structure as that of the portions 7A and 7B of the conductor 7, respectively, and are disposed in the same position as the portions 7A and 7B of the conductor 7. Like the conductor 7, the conductor 13 may be used to alleviate patterning related problems relating to the shape of the outermost portion 11A of the portions 11A of the conductor 11. That is, the conductor 13 may function during manufacturing steps as a dummy gate electrode. The conductor 13 is, for example, electrically floating (that is, not electrically connected to the element to which a potential in the semiconductor device 1 is applied), and is not applied with a potential during the operation of the semiconductor device 1. The conductor 13 may be referred to as a dummy gate electrode 13.

The dummy gate electrode 13 is derived from the same material as the material of the conductor 11. The dummy gate electrode 13 and the conductor 11 are formed by partial removal of the same material layer. Thus, when the conductor 11 comprises polysilicon, the dummy gate electrode 13 likewise comprises polysilicon. The dummy gate electrode 13 has substantially the same type and an amount of the carriers as provided in the conductor 11. Further, like the conductor 11, the dummy gate electrode 13 may include silicide. When the dummy gate electrode 13 includes silicide, the ratio of silicide in the dummy gate electrode 13 may be substantially the same as the ratio of silicide in the conductor 11.

The conductor 15 extends along the edge of the element region 3. The conductor extends along the outer edge of the dummy gate electrode 13 and surrounds the dummy gate electrode 13. The conductor 15 in this example includes four portions 15A and four portions 15B. One portion 15A extends along the x-axis and along the lower end of the element region 3. One portion 15A extends along the x-axis and along the upper end of the element region 3. One portion 15A extends along the y-axis and along the right end of the element region 3. One portion 15A extends along the y-axis and along the left end of the element region 3.

Each portion 15B is located in a region on a corner of the element region 3 and is connected to one portion 15A extending along the x-axis and one portion 15A extending along the y-axis. The portion 15B intersects, for example, the x-axis and the y-axis, and has, for example, an angle of 45 degrees with respect to the x-axis. The conductor 15 is partially located on the upper surface of the dummy gate electrode 13.

The conductor 15 may be used as a resistor (resistance element). When being used as a resistor, like the conductor 7, the conductor 15 is connected to contact plugs CP1 and CP2 on the upper surface. The conductor 15 may be referred to as a resistor 15. The resistor 15 may be used as any resistor necessary in the semiconductor device 1. The resistor 15 may be used in the same applications as that of the resistor 7 of the first embodiment.

Figure 11:
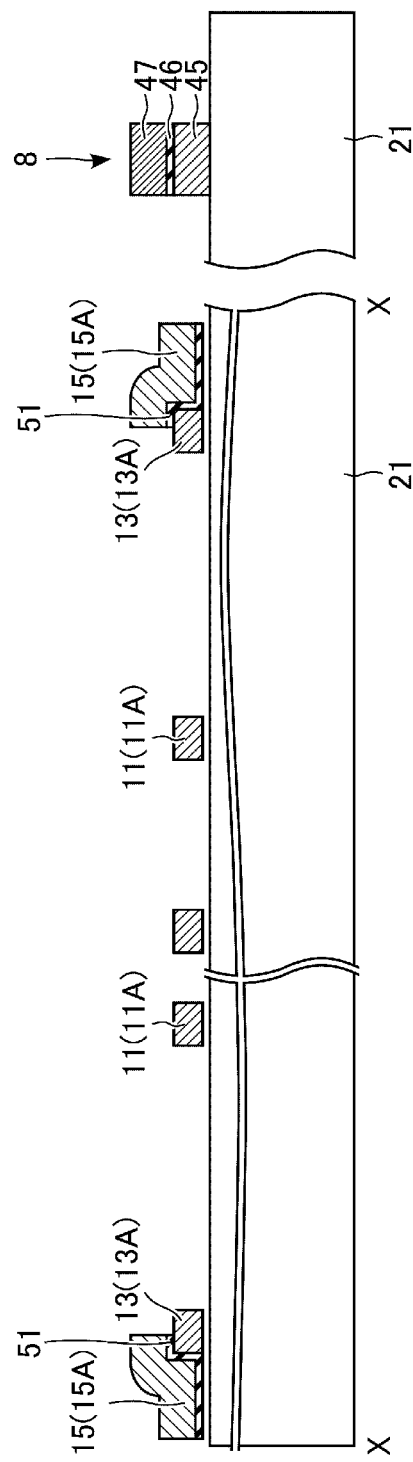
FIG. 11 shows a cross section of a semiconductor device of a second embodiment.

FIG. 11 shows a cross section along the XI-XI line of FIG. 10. FIG. 11 also shows a cross section of the capacitor 8. As shown in FIG. 11, the gate electrode 11 (more particularly, part 11A of the gate electrode 11) and the dummy gate electrode 13 (more particularly, part 13A of the dummy gate electrode 13) are provided on the upper side of the substrate 21. In FIG. 11, some elements including the internal elements of the substrate 21 and the silicide 12 are omitted for the purpose of avoiding unnecessary complexity of the drawing.

The capacitor 8 includes a conductor 45, an insulator 46, and a conductor 47. The conductor 45 is located on the upper surface of the substrate 21. The conductor 45, the gate electrode 11, and the dummy gate electrode 13 are derived from the same conductor material. That is, the conductor 45, the gate electrode 11, and the dummy gate electrode 13 can be formed by partial removal of the same conductor layer. Thus, the conductor 45 comprises polysilicon. The insulator 46 is located on the upper surface of the conductor 45. The conductor 47 is located on the upper surface of the insulator 46.

The insulator 51 is continuous from a part on the upper surface of the dummy gate electrode 13 to a part above the upper surface of the substrate 21. The insulator 51 extends along the outer edge of the dummy gate electrode 13 on the xy plane and surrounds the dummy gate electrode 13. The inner end of the insulator 51 is located on the upper surface of the dummy gate electrode 13. The insulator 51 and the insulator 46 are derived from the same insulator and are a part of the insulator. That is, the insulator 46 and the insulator 51 can be formed by partial removal of the same insulator layer.

The conductor 15 covers the upper surface of the insulator 51. The conductor 15 and the conductor 47 can be derived from the same conductor material. That is, the conductor 15 and the conductor 47 can be formed in the same process steps or the like. The conductor 15 and the conductor 47 comprise, for example. However, since the conductor 15 is to be used as a resistor, the resistivity of the conductor 15 may be adjusted so as to be different from that of the conductor 47. Specifically, the conductor 15 includes carriers of a type and/or concentration that provide the conductor 15 with a resistance of the desired magnitude.

With the above structure, the transistor 5 can be mounted with the capacitor 8 (including the conductor 45 of the first layer and the conductor 47 of the second layer sandwiching the insulator 46) in a mixed manner in one semiconductor device 1b.

2.2. Advantages

The semiconductor device 1b of the second embodiment includes the conductor 15 extending from the upper surface of the dummy gate electrode 13 to the upper surface of the substrate 21. The conductor 15 is used as a resistor. The dummy gate electrode 13 is provided for the single purpose of preventing variation in shape when the gate electrode 11 is formed, has no function after the formation of the gate electrode 11, and does not affect the function and characteristics of the transistor 5. The conductor 15 is provided by utilizing the region around the dummy gate electrode 13, and the conductor 15 can be used as a resistor. Therefore, it is possible to form a resistor in the element region 3 without affecting the formation and characteristics of the transistor 5. This means that the transistor 5 and the resistor are integrated into one element region 3. Therefore, the same advantages as those of the first embodiment may be obtained.

Furthermore, according to the second embodiment, the insulator 51 is formed of the same insulator as the insulator 46 of the capacitor 8, and the conductor 15 is formed of the same conductor as the conductor 47 of the capacitor 8. The patterning of the insulator 51 and the conductor 47 may be performed in the same processing steps or the like. Therefore, except for an additional step of introducing the carriers into the conductor 15, no other additional steps for forming the insulator 51 and the conductor 47 are necessary, and the insulator 51 and the conductor 47 may be easily formed.

2.3. Modification Examples

Figure 13:
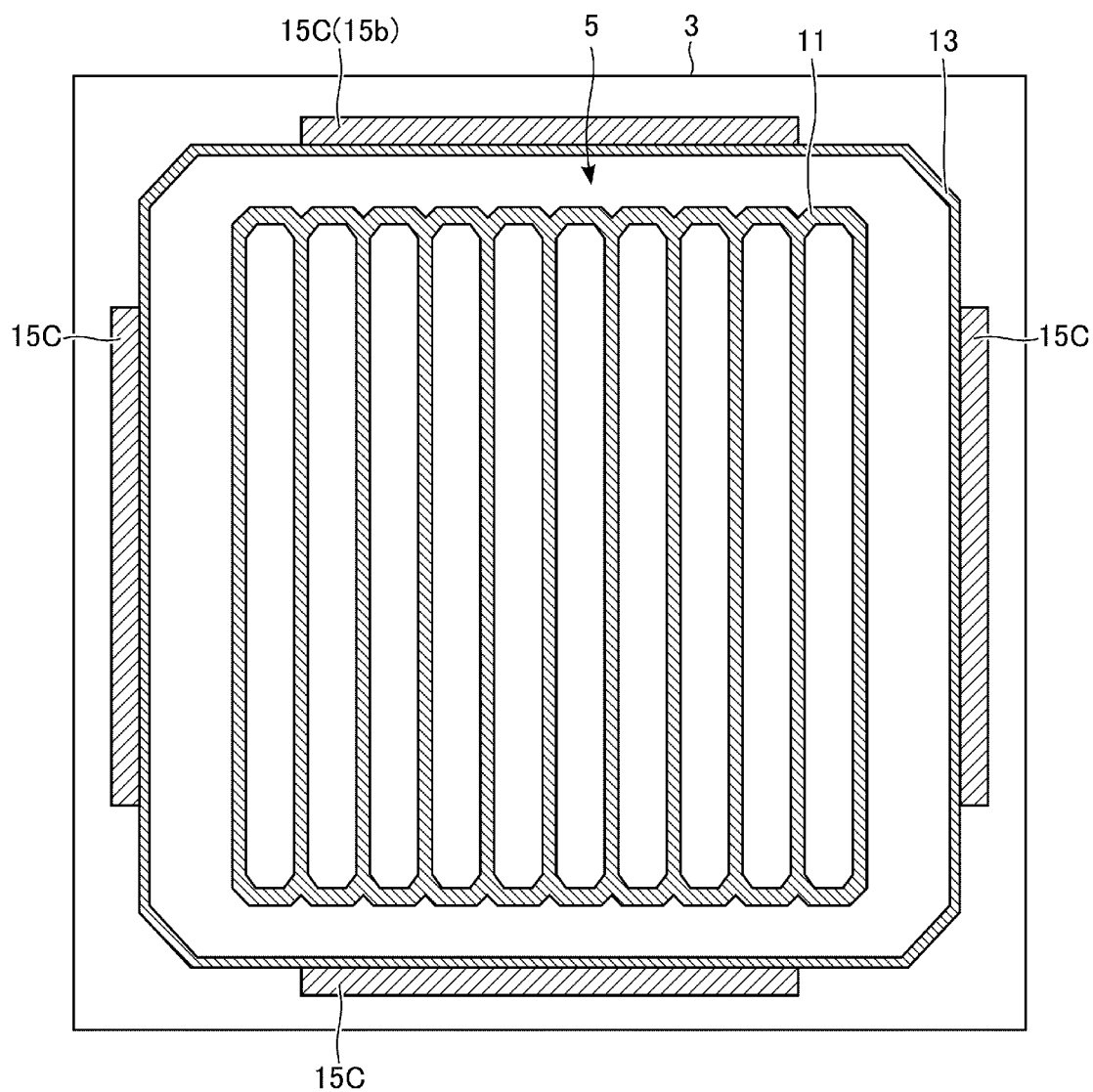
FIG. 13 shows a planar structure of elements in an element region of a semiconductor device of a modification example of the second embodiment.

The conductor 15 does not have to extend over the entire edge of the element region 3. The conductor 15 may include a plurality of independent portions. FIGS. 12 and 13 show such an example, and show an example of a planar structure of elements in the element region 3 of the semiconductor device 1b of the modification example of the second embodiment. FIGS. 12 and 13 show the same region as that of FIG. 10.

As shown in FIG. 12, a conductor 15b is provided in place of the conductor 15. Like the conductor 15, the conductor 15b extends along the edge of the element region 3 and surrounds the transistor 5. The conductor 15b includes a portion 15C and a portion 15D. The portion 15C is the same as the conductor 15 except for the shape. That is, like the conductor 15, the portion 15C includes carriers of a type and/or concentration to have a resistance of the desired magnitude, and/or has a ratio of silicide. Like the conductor 15, the portion 15C may be used as a resistor.

On the other hand, the portion 15D has substantially the same resistivity as that of the conductor 11, that is, the resistivity is not adjusted. Therefore, the portion 15D includes, for example, the carrier of the same type and concentration as that of the conductor 11, and/or includes silicide in the upper portion.

The portion 15C may occupy any portion of the conductor 15b. That is, the portion 15C has a size having a resistance of the required magnitude for the portion 15C. FIG. 12 shows an example in which each portion 15C occupies a part of four straight line portions along the edge of the element region 3 of the conductor 15. Each portion 15D is located in a region on a corner of the element region 3.

Through adjusting the size of the portion 15C of the conductor 15, it is possible to adjust the magnitude of the resistance provided by the portion 15C.

FIG. 12 shows an example in which the portions 15C are provided along all the sides of the edge of the element region 3. Modification examples are not limited to this. For example, a portion 15C may be located in only one, two, or three of the four straight line portions. The portion 15C may be located on any of the four straight line portions. For example, the portion 15C may be located only on the upper straight line portion and the lower straight line portion along the y-axis. Alternatively, the portion 15C may be located only in the left straight line portion and the right straight line portion along the y-axis.

As shown in FIG. 13, the portions 15D may be omitted.

3. Third Embodiment

A third embodiment differs from the second embodiment in the position of the conductor that functions as a resistor.

3.1. Structure (Configuration)

FIG. 14 shows a planar structure of a semiconductor device of the third embodiment, and shows a structure along the xy plane when observed from above along the z-axis. A semiconductor device 1c of the third embodiment is similar to the semiconductor device 1b of the second embodiment, but unlike the semiconductor device 1b of the second embodiment, does not include the dummy gate electrode 13.

The conductor 15 is along an outer edge of the gate electrode 11 instead of the periphery of the dummy gate electrode 13 as in the second embodiment.

FIG. 15 shows a cross section along the XV-XV line of FIG. 14. In FIG. 15, some elements including the internal elements of the substrate 21 and the silicide 12 are omitted for the purpose of avoiding unnecessary complexity of the drawing.

As shown in FIG. 15, the insulator 51 extends from the outer edge of the gate electrode 11, that is, a part of the region above the upper surface of the outermost portion 11A to a region of a part above the upper surface of the substrate 21. The insulator 51 surrounds the gate electrode 11. An inner end of the insulator 51 is located on the upper surface of the outermost portion 11A of the gate electrode 11. The conductor 15 covers the upper surface of the insulator 51.

3.2. Advantages

The semiconductor device 1c of the third embodiment includes a conductor 15 extending from above the upper surface of the outer edge portion of the gate electrode 11 to above the upper surface of the substrate 21. The conductor 15 can be used as a resistor. Therefore, even if the dummy gate electrode 13 is not provided, the conductor 15 may still be provided. Therefore, similar advantages as those in the second embodiment may be obtained.

3.3. Modification Examples

Figure 16:
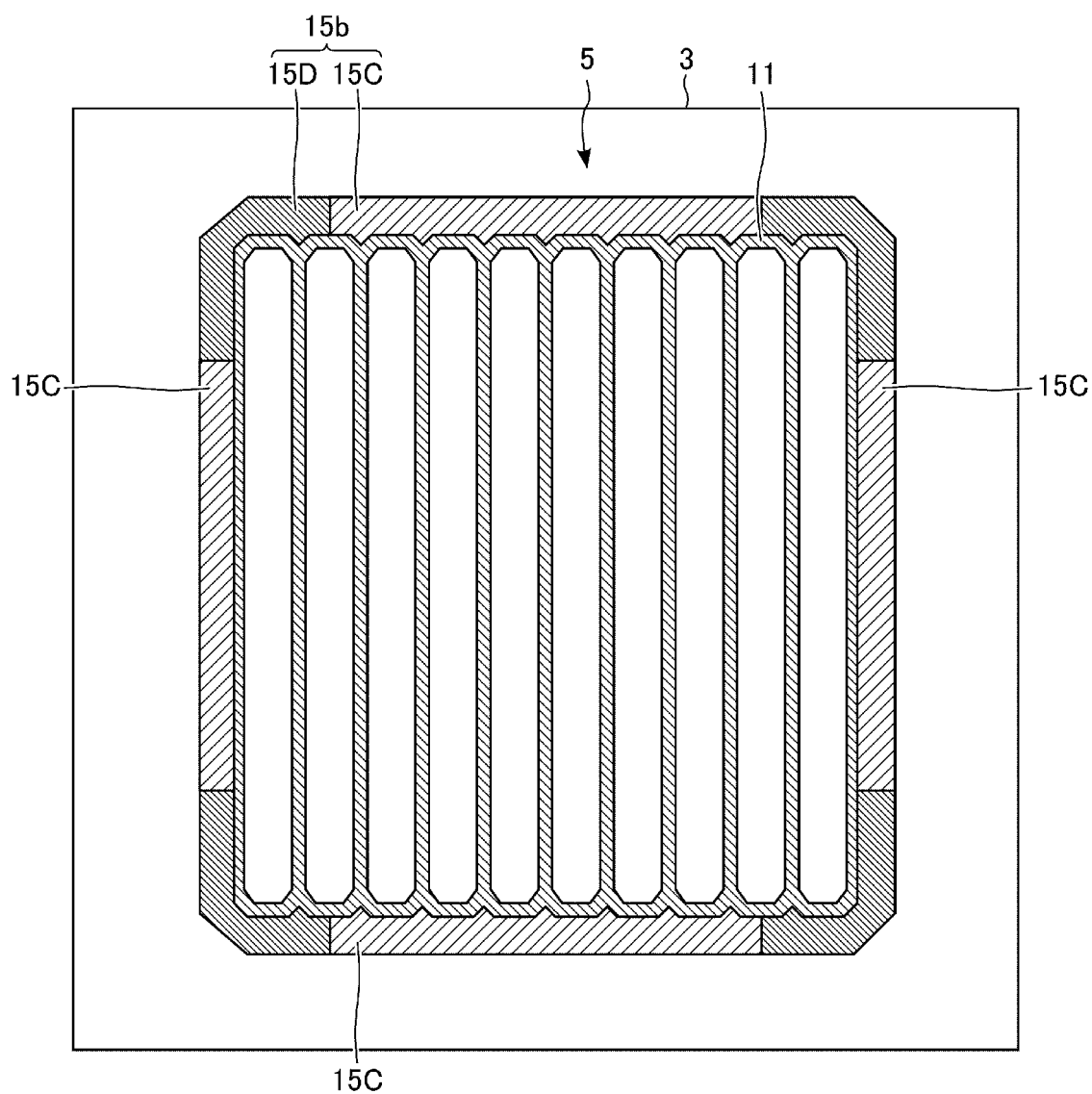
FIG. 16 shows a planar structure of elements in an element region of a semiconductor device of a modification example of the third embodiment.
Figure 17:
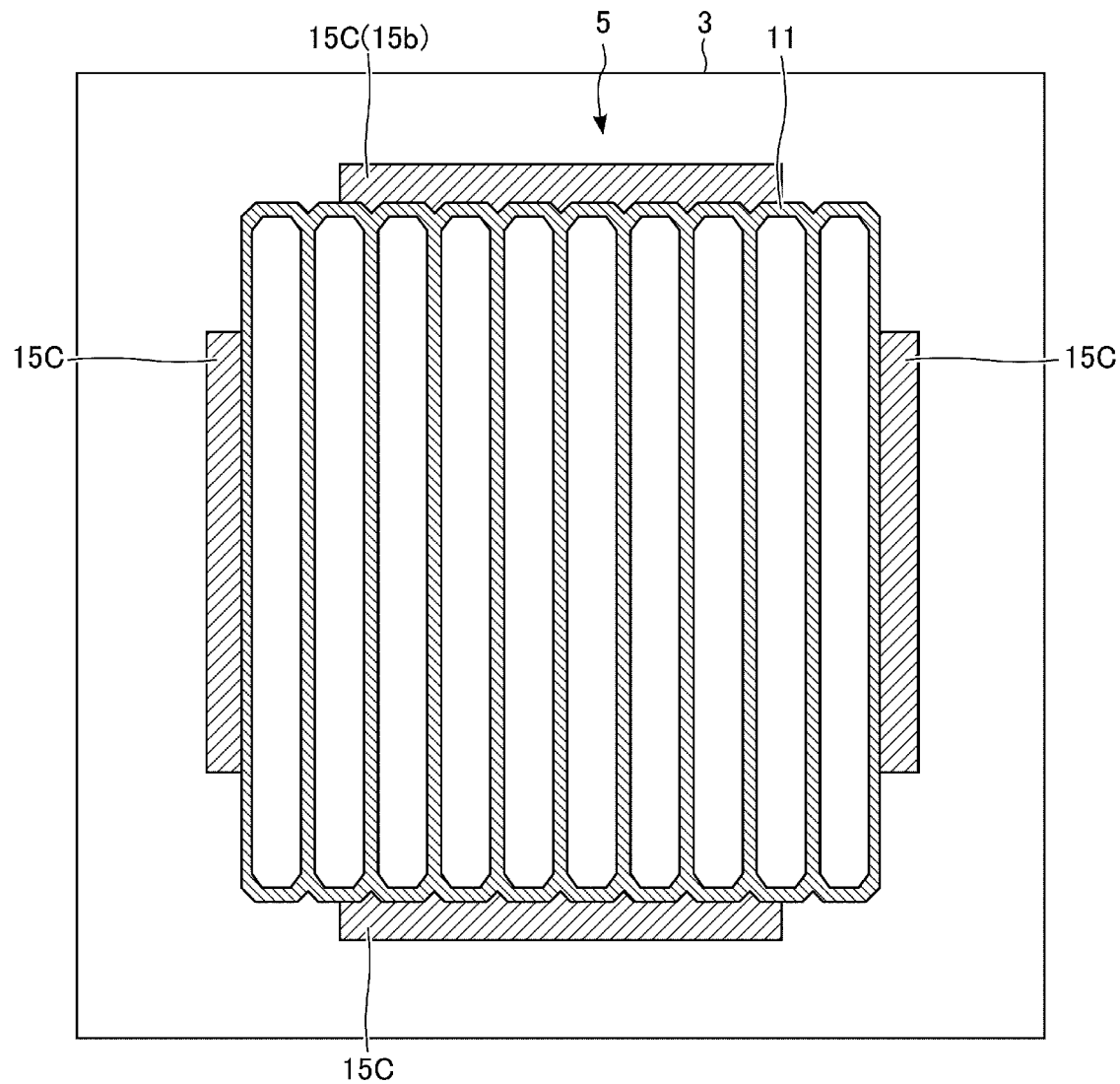
FIG. 17 shows a planar structure of elements in an element region of a semiconductor device of a modification example of the third embodiment.

The conductor 15 does not have to extend over the entire edge of the element region 3. The conductor 15 may comprise a plurality of independent portions. FIGS. 16 and 17 show such an example. FIGS. 16 and 17 show the same region as that of FIG. 14.

As shown in FIG. 16, a conductor 15b is provided in place of the conductor 15. Like the conductor 15, the conductor 15b extends along the edge of the element region 3 and surrounds the transistor 5. The conductor 15b includes a portion 15C and a portion 15D.

The portion 15C may occupy any portion of the conductor 15b. That is, the portion 15C may have a size providing a resistance of the required magnitude. FIG. 16 shows an example in which each portion 15C occupies a part of four straight line portions along the outer edge of the gate electrode 11 in the conductor 15.

In FIG. 16, the portion 15C may be located in only one, two, or three of the four straight line portions. The portion 15C may be located on any of the four straight line portions. For example, the portion 15C may be located only on the upper straight line portion and the lower straight line portion along the y-axis. Alternatively, the portion 15C may be located only in the left straight line portion and the right straight line portion along the y-axis.

As shown in FIG. 17, the portions 15D may be omitted.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
   a substrate having a first surface;
   an insulator that surrounds a first region of the first surface;
   a gate electrode on the first region and having a first resistivity; and
   a first conductor on the first region, the first conductor comprising a same material as the gate electrode, but having a second resistivity different from the first resistivity, wherein
   the gate electrode includes a silicide at a first ratio, and
   the first conductor includes the silicide at a second ratio that is lower than the first ratio.

2. The semiconductor device according to claim 1, wherein the first conductor is between the insulator and the gate electrode when viewed from a direction orthogonal to the first surface.

3. The semiconductor device according to claim 1, wherein at least a part of the gate electrode and at least a part of the first conductor extend along the first surface in the same direction.

4. The semiconductor device according to claim 1, wherein the first conductor includes different dopant types than dopant types in the gate electrode.

5. The semiconductor device according to claim 1, wherein the first conductor has a different concentration of dopants than the gate electrode.

6. The semiconductor device according to claim 1, wherein the first conductor surrounds the gate electrode in a plane parallel to the first surface.

7. The semiconductor device according to claim 1, wherein the first conductor comprises a plurality of separate portions spaced from each other.

8. The semiconductor device according to claim 1, wherein the first conductor is comprised of a material having a higher electrical resistance than the gate electrode.

9. The semiconductor device according to claim 1, wherein the first conductor is a resistor element electrically connected to a transistor element in the first region.

10. The semiconductor device according to claim 1, further comprising:
    a dummy gate electrode between the first conductor and the gate electrode.

11. The semiconductor device according to claim 1, wherein
    the first conductor overlaps a portion of the gate electrode, and
    an insulator layer separates the first conductor from the portion of the gate electrode.

12. A semiconductor device, comprising:
    a substrate having a first surface;
    an insulator that surrounds a first region of the first surface;
    a gate electrode on the first region and having a first resistivity; and
    a first conductor on the first region, the first conductor comprising a same material as the gate electrode, but having a second resistivity different from the first resistivity, wherein
    the first conductor surrounds the gate electrode in a plane parallel to the first surface.

13. The semiconductor device according to claim 12, wherein
    the first conductor is between the insulator and the gate electrode when viewed from a direction orthogonal to the first surface, and
    at least a part of the gate electrode and at least a part of the first conductor extend along the first surface in the same direction.

14. The semiconductor device according to claim 12, wherein dopants in the first conductor differ in type or concentration from those in the gate electrode.

15. The semiconductor device according to claim 12, wherein
the gate electrode includes a silicide on an upper surface, and
the first conductor includes no silicide.

16. The semiconductor device according to claim 12, further comprising:
a dummy gate electrode between the first conductor and the gate electrode.

17. The semiconductor device according to claim 12, wherein
the first conductor overlaps a portion of the gate electrode, and
an insulator layer separates the first conductor from the portion of the gate electrode.

18. A semiconductor device, comprising:
a substrate having a first surface;
an insulator that surrounds a first region of the first surface;
a gate electrode on the first region and having a first resistivity; and
a first conductor on the first region, the first conductor comprising a same material as the gate electrode, wherein
the first conductor comprises a plurality of separate portions spaced from each other.

19. The semiconductor device according to claim 18, wherein
the gate electrode includes a silicide on an upper surface, and
the first conductor includes no silicide.

20. The semiconductor device according to claim 18, further comprising:
a dummy gate electrode between the first conductor and the gate electrode.

21. The semiconductor device according to claim 18, wherein
the first conductor overlaps a portion of the gate electrode, and
an insulator layer separates the first conductor from the portion of the gate electrode.

* * * * *